United States Patent [19]

Nallan et al.

[11] Patent Number: 6,132,631
[45] Date of Patent: Oct. 17, 2000

[54] ANISOTROPIC SILICON NITRIDE ETCHING FOR SHALLOW TRENCH ISOLATION IN AN HIGH DENSITY PLASMA SYSTEM

[75] Inventors: Padmapani Nallan; Ajay Kumar, both of Sunnyvale; Jeffrey Chinn, Foster City, all of Calif.

[73] Assignee: Applied Materials, Inc., Santa Clara, Calif.

[21] Appl. No.: 08/907,448

[22] Filed: Aug. 8, 1997

[51] Int. Cl.$^7$ .................................................. H01L 21/318
[52] U.S. Cl. ................................ 216/16; 216/17; 216/39; 216/67; 216/79; 438/724
[58] Field of Search .................. 216/16, 17, 39, 216/58, 63, 67, 74; 438/700, 710, 724, 744; 252/79.1, 372, 182.11, 182.12, 182.32

[56] References Cited

U.S. PATENT DOCUMENTS

| | | | |
|---|---|---|---|
| 4,997,775 | 3/1991 | Cook et al. | 438/322 |
| 5,068,202 | 11/1991 | Crotti et al. | 438/433 |
| 5,408,998 | 3/1995 | Chiu et al. | 257/368 |
| 5,447,884 | 9/1995 | Fahey et al. | 438/437 |
| 5,686,345 | 11/1997 | Harmon et al. | 438/702 |
| 5,763,315 | 6/1998 | Benedict et al. | 438/424 |
| 5,843,846 | 12/1998 | Nguyen et al. | 438/713 |
| 6,008,131 | 12/1999 | Chen | 438/710 |

OTHER PUBLICATIONS

S. Wolf, Silicon Processing for the VLSI Era vol. 2—Process Integration, Lattice Press, Sunset Beach CA, pp. 35, 52–55, 1990.

*Primary Examiner*—Randy Gulakowski
*Assistant Examiner*—Allan Olsen
*Attorney, Agent, or Firm*—Birgit Morris

[57] ABSTRACT

An etchant mixture of carbon tetrafluoride and argon in a plasma etch chamber produces straight walled isolation trenches in a silicon nitride layer, the trenches having rounded bottoms and no microtrenching.

7 Claims, 2 Drawing Sheets

ANISOTROPIC SILICON NITRIDE ETCHING FOR SHALLOW TRENCH ISOLATION IN AN HIGH DENSITY PLASMA SYSTEM

This invention relates to etching of silicon nitride. More particularly, this invention relates to etching anisotropic openings in silicon nitride, the openings having rounded bottoms and no microtrenching.

BACKGROUND OF THE INVENTION

During state-of-the-art semiconductor processing of semiconductor devices, many devices are made in a single substrate. These devices are connected to each other by means of conductive lines. However, since these conductive lines can introduce unwanted electric signals in the semiconductor substrate during operation of the devices, the devices must be separated from each other by some means of isolation. The usual means of isolation is to etch trenches between the devices that can be filled with an isolation material.

In order to maintain the critical dimension control of the active area, the sidewalls of the nitride layer must be straight, requiring an anisotropic etch; the etch chemistry must be such that unwanted materials do not deposit on the sidewalls or the bottom of the trench (such as polymeric compositions) and the bottom of the trench must have rounded bottoms and no microtrenching.

Conventional etchants for silicon nitride include fluorocarbons, e.g., freons, and hydrohalides, such as HBr or HCl. The use of freons is being discouraged for environmental reasons, and the use of hydrogen halides causes formation of polymeric residues, and deposits the residues on the sidewalls and bottom of the etched trench as well as on the chamber walls. Thus a good etchant composition for etching silicon nitride for shallow trench formation must produce straight walled openings, must not form deposits on the sidewalls or bottom of the trench, and must be anisotropic throughout. These stringent requirements for an etchant are difficult to achieve and have continued to be sought.

SUMMARY OF THE INVENTION

We have found that an etchant composition comprising carbon tetrafluoride and argon meets the requirements for an anisotropic etchant that produces clean, straight walled, rounded bottom openings in silicon nitride for shallow trench isolation applications.

BRIEF DESCRIPTION OF THE INVENTION

DETAILED DESCRIPTION OF THE INVENTION

Figure 1:
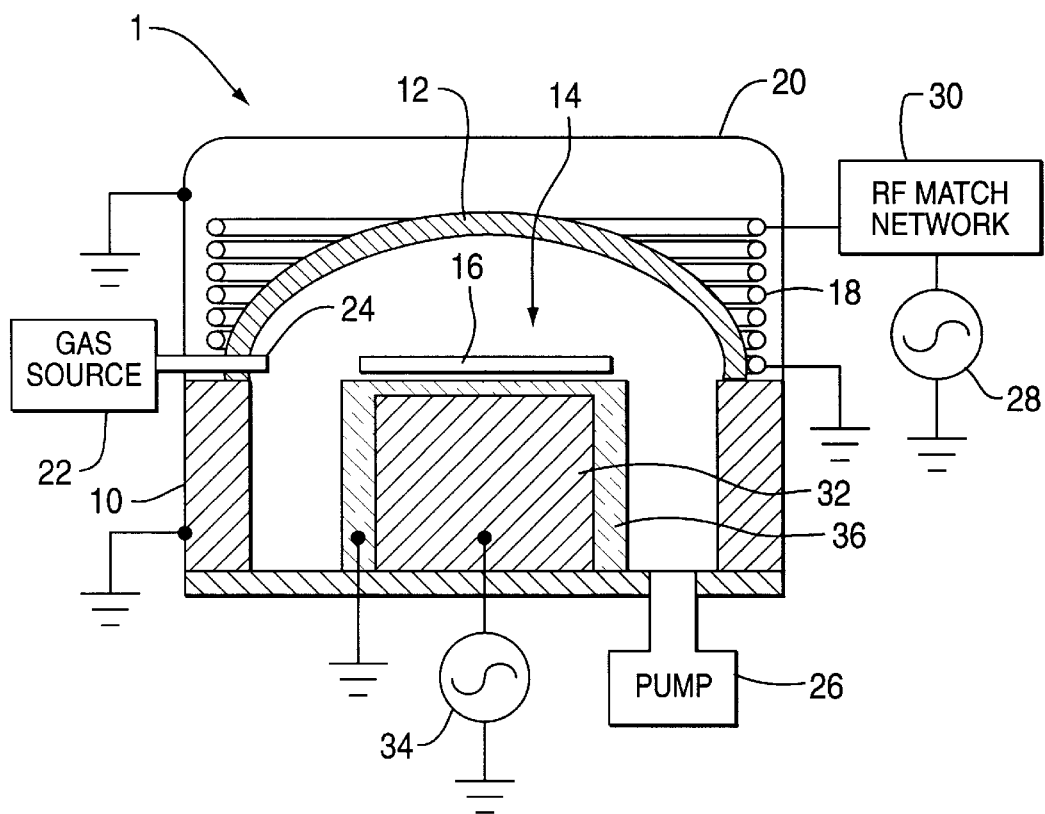
FIG. 1 is a schematic cross sectional view of a plasma reactor in which the present etch of silicon-containing material can be carried out.

The present etch composition comprises carbon tetrafluoride and argon. Etching can be suitably carried out in a plasma reactor such as shown in FIG. 1. This chamber is known as a decoupled plasma source chamber. Referring to FIG. 1, an inductively coupled RF plasma reactor includes a reactor chamber 1 having a grounded conductive cylindrical sidewall 10 and a shaped dielectric ceiling 12, e.g., dome-like. The reactor includes a substrate pedestal 14 for supporting a semiconductor substrate 16 in the center of the chamber 1; a cylindrical inductor coil 18 surrounding an upper portion of the chamber beginning near the plane of the top of the substrate or substrate pedestal 14 and extending upwardly therefrom toward the top of the chamber 1; a process gas source 22 and a gas inlet 24 which can be a plurality of inlets spaced about the chamber 1 interior; and a pump 26 for controlling the chamber pressure. The coil inductor 18 is energized by a plasma source power supply or RF generator 28 through a conventional active RF match network 30, the top winding of the coil inductor 18 being "hot" and the bottom winding being grounded. The substrate pedestal 14 includes an interior conductive portion 32 connected to a bias RF power supply or generator 34 and an exterior grounded conductor 36 (insulated from the interior conductive portion 32). A conductive grounded RF shield 20 surrounds the coil inductor 18. In accordance with one aspect of the chamber 1, uniformity of the plasma density spatial distribution across the substrate is improved by shaping the ceiling 12 as a multi-radius dome and individually determining or adjusting each one of the multiple radii of the ceiling 12. The multiple-radius dome shape in the embodiment of FIG. 1 somewhat flattens the curvature of the dome ceiling 12 around the center portion of the dome, the peripheral portion of the dome having a steeper curvature.

During processing, the power sources are turned on and processing gas passed into the chamber 1, forming a high density plasma in the chamber 1. The power to the chamber 1 from the inductive RF power source 28 is suitably up to about 3000 watts. The RF source can be a 13.56 MHz power source. The bias power to the substrate support 14 can vary up to 1000 watts, which provides a good etch rate. The bias frequency can vary up to about 13.56 MHz. This provides improved profile control. However, the above frequencies are given for purposes of illustration only and different frequencies can be used. Frequencies as low as 30 kHz and up to 13.56 MHz and multiples thereof can be used.

The pressure in the chamber during processing is important; generally the etch rate decreases with pressure, but at higher pressures bottom corner rounding can be improved. Preferably a pressure of about 4 to about 100 millitorr is used.

The power to the chamber 1 from the inductive coil power source is suitably about 200 to about 2000 watts. The bias power to the substrate support can vary from about 20 to about 400 watts.

The substrate is cooled during etch processing, generally by means of a coolant passed to a channel in the substrate support electrode (not shown). In addition, a flow of a coolant such as helium can be passed between the substrate and the substrate support to enhance cooling and maintain the temperature of the substrate within the desired range, generally from 20 to about 100°C.

The amounts of carbon tetrafluoride passed into the chamber can vary from about 20 to 100 sccm. The amount of argon can vary from about 50 to 150 sccm, which etches straight walled anisotropic openings in silicon nitride with high etch rates. The argon provides the high ion bombardment needed to obtain anisotropic etching and to sputter away any polymeric residues that may deposit on the sidewalls or bottom of the trench or on the surface of the substrate.

The invention will be further described in the following Example, but the invention is not meant to limited by the details described therein.

EXAMPLE 1

A substrate having a silicon oxide layer 250 Å thick and an overlying silicon nitride layer 2000 Å thick was masked and mounted on the substrate support in the chamber of FIG. 1.

A mixture of 80 sccm of $CF_4$ and 120 sccm of argon were passed into a chamber. The pressure in the chamber was 50 millitorr; the source power was 1000 watts; the bias power was 200 watts and the cathode temperature was 45° C.

The silicon nitride etch rate was 2200 Å/min.

Figure 2:
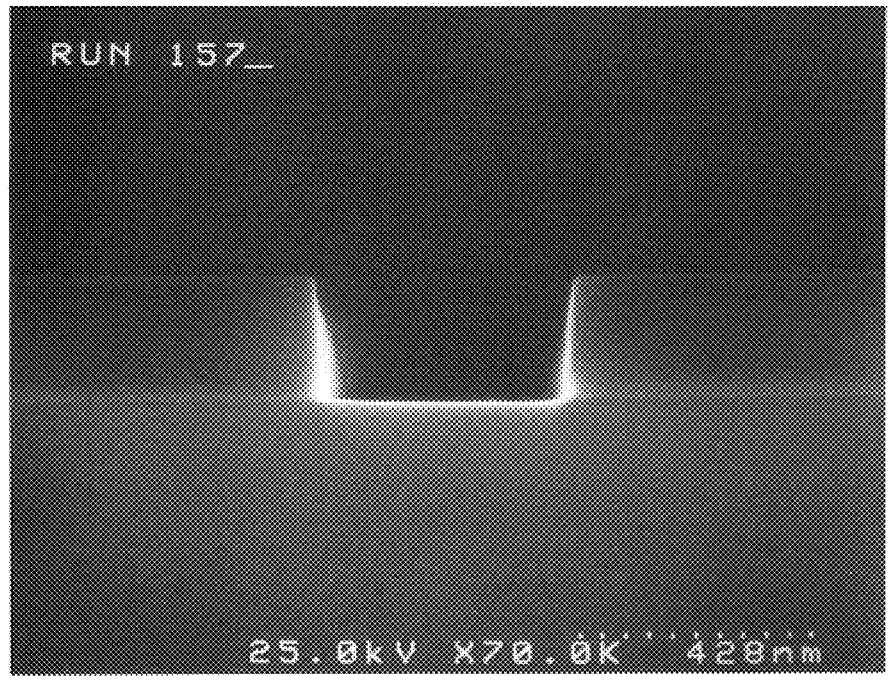
FIG. 2 is a photograph of a cross sectional view of an opening formed in silicon nitride in accordance with the present invention.
Figure 3:
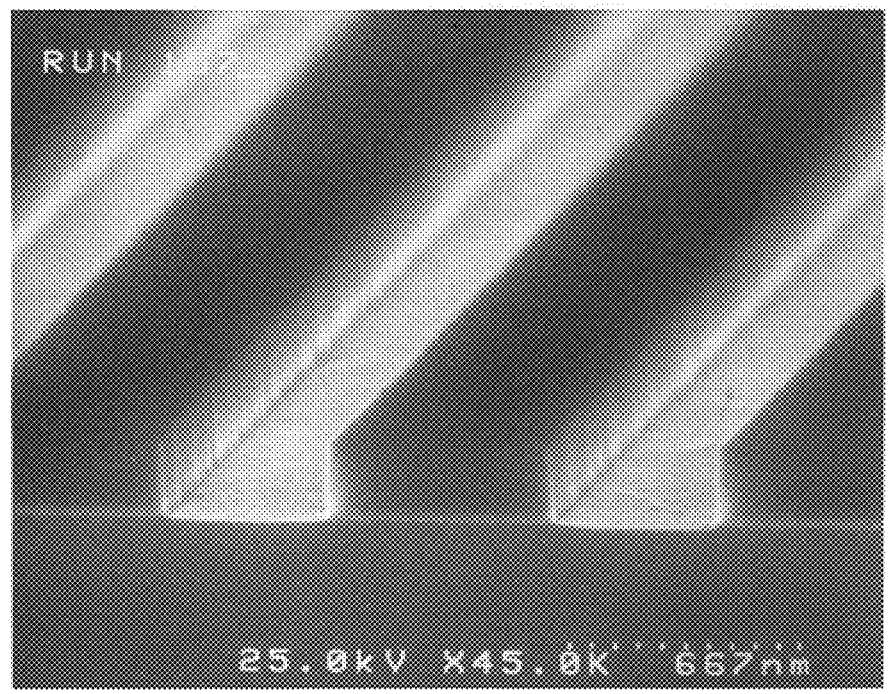
FIG. 3 is a photograph of a top view of an opening formed in silicon nitride in accordance with the present invention.

FIGS. 2 and 3 are photographs of cross section and top views respectively of the etched openings obtained. As can be seen in FIG. 2, the trench has straight sidewalls (88–90°) with no microtrenching, and the sidewall a smooth rounded interface between the bottom and a smooth sidewall with no deposits thereon. FIG. 3 shows two adjacent trenches formed in silicon nitride.

Although the present invention has been described in terms of specific embodiments, it will be apparent to one skilled in the art that various changes in reaction conditions, etch composition and substrate structure can be made. Thus the invention is meant only to be limited by the scope of the appended claims.

We claim:

1. A method of amisotropically etching straight walled, trenches in a silicon nitride layer on a substrate comprising passing a plasma precursor gas mixture consisting essentially of carbon tetrafluoride and argon into a plasma vacuum chamber, said substrate mounted on a substrate support connected to an RF power source, and forming a plasma from the precursor mixture.

2. A method according to claim 1 wherein the substrate temperature is maintained between about 20 to 100° C.

3. A method according to claim 1 wherein carbon tetrafluoride is added to the chamber at a flow rate of from 20 to 100 sccm and argon is added to the chamber at a flow rate of from 50 to 150 sccm.

4. A method according to claim 1 wherein the etch trench sidewalls have an angle of 88 to 90 degrees.

5. A method according to claim 1 wherein the plasma is formed by inductive coupling.

6. A method according to claim 1 wherein the chamber pressure is from about 4 to 100 millitorr.

7. A method according to claim 1 wherein said vacuum chamber has a shaped dielectric ceiling.

* * * * *